United States Patent [19]

Lee et al.

[11] 4,445,096
[45] Apr. 24, 1984

[54] THERMALLY STABILIZED IMPATT OSCILLATOR

[75] Inventors: Kang W. Lee, San Jose; Allen F. Podell, Palo Alto, both of Calif.

[73] Assignee: Varian Associates, Inc., Palo Alto, Calif.

[21] Appl. No.: 468,095

[22] Filed: Feb. 22, 1983

Related U.S. Application Data

[63] Continuation of Ser. No. 145,085, Apr. 30, 1980, abandoned.

[51] Int. Cl.³ .............................................. H03B 9/14
[52] U.S. Cl. .............................. 331/107 DP; 331/176
[58] Field of Search ...... 331/107 R, 107 DP, 107 SL, 331/117 D, 176, 69, 70; 333/229, 234

[56] References Cited

U.S. PATENT DOCUMENTS

| | | | |
|---|---|---|---|
| 3,831,109 | 8/1974 | Leiby | 331/176 X |
| 3,986,153 | 10/1976 | Kuno et al. | 331/107 SL X |
| 4,151,488 | 4/1979 | Wallace | 331/107 R |

FOREIGN PATENT DOCUMENTS 2410598 9/1975 Fed. Rep. of Germany ...... 331/107 DP

OTHER PUBLICATIONS

Ying et al., "Millimeter-Wave Pulsed IMPATT Diode Oscillators", IEEE Journal of *Solid State Circuits,* vol. SC-11, No. 2, Apr. 1976, pp. 279-285.

Chao et al., "Pulsed IMPATT Diode Oscillators Above 200 GHz"; IEEE International *Solid-State Circuits Conference,* Feb. 1977, pp. 130-131.

*Primary Examiner*—Siegfried H. Grimm
*Attorney, Agent, or Firm*—Stanley Z. Cole; Norman E. Reitz

[57] ABSTRACT

An IMPATT oscillator is thermally stabilized for pulsed operation by utilizing the dissipative heat during subperiods of pulsed operation and a variable self-heating due to a bias voltage applied during non-oscillating subperiods. The oscillator comprises an IMPATT diode mounted on a platform which is attached to a housing defining a resonating cavity. The platform has a thermally insulating base with a layer of thermally and electrically conducting material applied thereon. The thickness of the layer of thermally and electrically conducting material must be sufficient to permit microwave resonances to occur within the cavity. The thermal resistance of the layer is selected to permit the junction temperature to remain constant even for the highest ambient temperature condition. Constant junction temperature over a wide range of ambient temperature produces constant power and frequency characteristics.

6 Claims, 7 Drawing Figures

THERMALLY STABILIZED IMPATT OSCILLATOR

This application is a continuation of application Ser. No. 145,085 filed Apr. 30, 1980, and now abandoned.

DESCRIPTION

BACKGROUND OF THE INVENTION

This invention relates to a thermally stabilized IMPATT oscillator and, more particularly, relates to an IMPATT oscillator thermally stabilized for pulsed operation which achieves constant power and frequency output over a wide ambient temperature range.

Semiconductor devices produce heat as a byproduct of normal operation. This effect is especially significant with power semiconductor devices, such as IMPATT diodes which are used as sources of high frequency oscillation. With these devices the heat which is generated is usually an unwanted byproduct. The temperature has an impact on device operation so that output power and frequency may be affected by uncontrolled temperature variations. See H. M. Olson, et al., "Temperature Transients in IMPATT Diodes", IEEE Trans. on Elect. Dev., ED-23, pp. 494–503 (1976); W. E. Schroeder, et al., "The Effect of Temperature on the Operation of an IMPATT Diode", Proc. IEEE (Lett.), vol. 59, pp. 1242–1244, August 1971; and J. R. Grierson, "Theoretical Calculations on the Effect of Temperature on the Operation of IMPATT Diode", Electron. Lett., vol. 8, pp. 258–260, May 1972. If the heat is of sufficient magnitude and is present for sufficient lengths of time, device operation may be permanently impaired due to impurity migration or the IMPATT package may rupture. Thus, for continuous wave operation, one normally employs low thermal resistance, high thermal mass heat sinks to keep the junction temperature less than a critical operating temperature, e.g., 200° C. If operating conditions, such as ambient temperature remain generally constant, then an equilibrium junction temperature will be reached; however, ambient temperature will likely vary over a range thereby producing changes in junction temperature and associated changes in operating characteristics.

For pulsed operation of the type useful in radar applications, especially pulsed operation of low duty cycle (generally less than 30% and often only several percent) heat dissipation is not the chief concern. In fact, for a given amount of heat that may be tolerated by the device and its package, higher peak powers are possible since the heat generated in short bursts of power is averaged out over time. Rather, it is desired to operate the IMPATT oscillator at a constant temperature in order to ensure uniform operating characteristics. Thus, with IMPATT diodes operating in the pulsed mode it is desirable to obtain thermal stability. This stability could be obtained by applying a variable amount of heat by an external heater to always keep the diode junction at a specified temperature. However, such a technique requires the heating of a large thermal mass so that high thermal time constants and long stabilization times are inherent. Also, it is bulky, heavy and wastes energy.

It is therefore an object of the present invention to provide a thermally stabilized IMPATT oscillator for operation in the pulsed mode wherein the diode junction has a bias voltage applied during non-oscillating subperiods to draw sufficient current across the junction so that on a time averaged basis a desired junction temperature is maintained over a wide ambient temperature range.

It is an additional object of the present invention to provide an IMPATT oscillator having a stabilized temperature characteristic which utilizes a platform for mounting an IMPATT diode which has a preselected thermal impedance.

IN THE DRAWINGS

For a more complete understanding of the thermally stabilized oscillator of the present invention reference may be had to the drawings which are incorporated hereby by reference and in which.

SUMMARY OF THE INVENTION

The IMPATT oscillator of the present invention is thermally stabilized for pulsed operation. It utilizes the dissipative heat produced during subperiods of pulsed operation and a variable heating due to bias voltage applied during non-oscillating subperiods to produce a constant junction temperature over a wide range of ambient temperature.

An IMPATT diode is mounted on a platform which is adapted to be attached to a housing defining a resonating cavity. The platform has a thermally insulating base with a layer of thermally and electrically conducting material applied thereon. The thickness of the layer of thermally and electrically conducting material must be sufficient to permit microwave resonances to occur within the cavity. The thermal resistance of the layer is selected to permit the junction temperature to remain constant even for the highest ambient temperature condition.

DESCRIPTION OF THE PREFERRED EMBODIMENTS

The structure, theory of operation and potential applications for IMPATT diodes are well known. See, for example, G. I. Haddad, Avalanche Transit-Time Devices (1973). IMPATT diodes are incorporated in microwave resonators and powered by power supplies called modulators to form functioning oscillators. These are generally substituted for magnetrons in certain microwave applications and are serving to extend some applications. They are used where reliability, small size and low voltage requirements are important. As with magnetrons, the generation of high power RF signals by IMPATT oscillators is possible in both continuous wave and pulsed modes. Since pulsed modes are desirable for radar applications, and since reliability and small size are desirable for these applications, the pulsed mode is a common mode of operation of IMPATT oscillators. In this mode high frequency oscillations on the order of gigahertz are generated for subperiods and at pulse repetition rates which determine both pulse width and duty cycle.

Figure 6:
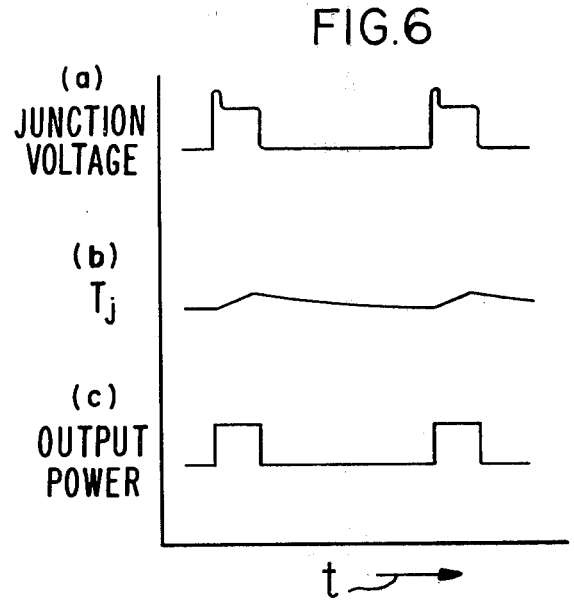
FIG. 6 shows at a, b and c curves representing, respectively, junction voltage, junction temperature and output power versus time for the thermally stabilized IMPATT oscillator of the present invention.

As described previously, power semiconductor devices such as IMPATT diodes generate heat during operation. In the pulsed mode of operation addressed in this invention, IMPATT diodes would typically have a duty cycle less than 30%. Thus, during the subperiods of power operation, i.e., during the time when pulses are generated, a device would experience heating. As shown in FIG. 6b, one would experience brief heating pulses and then the device would cool towards a stabilized baseline temperature in the intermediate time periods. Since the pulse repetition rates are on the order of kilohertz, the periods are likely to be smaller than the thermal time constant so that, externally, one would measure a baseline or settling level $T_j$ as in FIG. 6b. This level would normally be dependent upon ambient temperature, the insulating properties of the device package, the power level of the device, pulse width and duty cycle. It represents a given temperature level, one that should not exceed safe device limits. However, the level will not normally be stable because there will be variations in ambient temperature. Also, there may be variations in the power level of which the device is operated and changes in the duty cycle; the greater the duty cycle, the more the heating from this inherent source.

The present invention utilizes the heat generated during pulsed operation as a given or inherent source of heat and combines it with a variable self-heating source which is provided by drawing a variable current across the diode junction during non-oscillating subperiods. The variable self-heating source actively and inversely follows the instantaneous junction temperature. Thus, junction temperature is maintained constant by internal heating over a wide range of ambient temperature. What occurs is that in lieu of supplying heat externally as set out above in the prior art, the present invention supplies heat internally. The heat is provided by junction heating right at the junction where thermal stabilization is crucial and does so in a manner which accurately and instantaneously tracks junction temperature.

STRUCTURE

Figure 1:
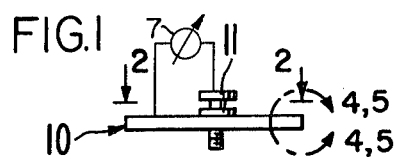
FIG. 1 is a side view of a packaged IMPATT diode screwed into a platform.
Figure 2:
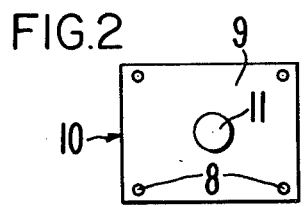
FIG. 2 is a plan view of the diode and platform of FIG. 1.
Figure 3:
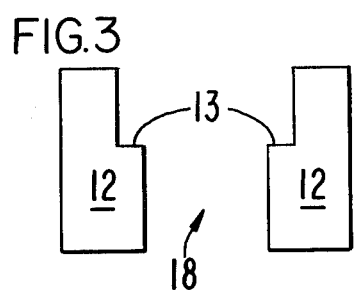
FIG. 3 is a partial pictorial view of an oscillator housing defining a resonating cavity.

IMPATT diodes are multilayer epitaxial structures which are mounted in discrete metal packages such as the Varian N-33 for C band (4–8 GHz) or the Varian N-57 for X Band (8–12 GHz) and above. In practicable oscillators they are typically mounted in packaged form on platforms (conceivably they could be mounted as individual die) which form a part of a housing defining a resonating cavity. As shown in FIGS. 1 and 2, a packaged IMPATT diode 11 is screwed into platform 10. The platform 10 is then attached to the recessed lip 13 formed in housing 12, shown in partial pictorial view in FIG. 3; this may be accomplished by fastening screws or rivets through holes 8 onto recessed lip 13. The housing 12 is typically fabricated from a thermally conductive material such as aluminum and has a high thermal mass compared to the diode, diode package or platform. The housing 12 defines a resonating cavity 18. When platform 10 is mounted in place, the diode 11 is presented at one end of the axis of resonating chamber 18.

The thermally and electrically conducting surface 9 of platform 10 forms a portion of the inner wall of the resonating cavity 18. A resonating member (not shown) is typically placed over the diode 11 to communicate radio frequency oscillations into the chamber along its axis so that oscillations wil occur.

Figure 4:
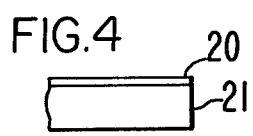
FIG. 4 is a detailed partial cross sectional view of one embodiment of a platform in accordance with the present invention.
Figure 5:
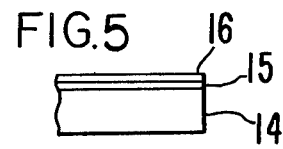
FIG. 5 is a detailed partial cross sectional view of another embodiment of a platform in accordance with the present invention.

Platform 10 as shown in FIGS. 4 and 5 is a laminar structure having a thermally insulating base 21 or 14 fabricated from material such as the HI-3000 polyimide of Howe Industries, Inc. The thickness is typically about 1/16 inches. In FIG. 4 a layer 20 of a highly thermally conductive material such as nickel is shown to be cladded or deposited onto thermally insulating base 21. Since the layer 20 forms a part of the wall of the resonating cavity, the material must be electrically conductive and preferably have a thickness greater than the skin depth of the radio frequency waves which are resonating in the chamber; it serves no useful purpose to obtain thermal stability in accordance with the present invention if the functioning of the microwave oscillator is impaired. The thermal resistance, $\theta$, of the platform will depend on the thickness and thermal conductivity of the material of layer 20, and upon the radial distance from the edge of the contact of packaged diode 11 with layer 20 to the contact with lip 13. It will also depend on the thermal resistance introduced respectively, by the contacts between the diode package and the platform and between the platform and recess in the housing. A variable among these factors that is readily selectable is the thickness of the layer and this may be chosen to determine $\theta$. Any other variable which affects $\theta$ may be varied as well. An alternative embodiment is shown in FIG. 5. A highly electrically conductive, highly thermally conductive layer 16 of gold (0.2 mil) is applied over a layer 15 of less thermally conductive but mechanically strong material such as stainless steel (2 mil); this structure has a thermal resistance of about 120°–130° C. per watt. The layer 15 is applied to provide mechanical strength and to enhance adhesion of layer 16, i.e., to reduce the possibility of flaking.

The IMPATT diode is electronically driven by a power supply shown as modulator 7 in FIG. 1. The modulator 7 generates pulsed operating power so that during pulse subperiods the operating voltage $V_o$ is supplied to the diode. During nonoscillating subperiods the modulator 7 is designed to function as a constant voltage source, i.e., maintains $V_{bias}$ constant, so that a variable current can be driven across the diode junction to produce variable self-heating as discussed subsequently. To compensate for the space charge resistance of the diode and other small parasitic resistances in the circuit, the voltage source is designed to have a small negative temperature coefficient. Modulators and constant voltage sources are well known in the electrical arts.

THEORY

Once a thermal resistance $\theta$ is selected for a given platform and resonator housing configuration, the temperature equilibration for pulsed IMPATT operation can be mathematically determined. With no heating of the junction during the non-oscillating portion of the duty cycle the temperature would be given by $$T_j = T_A + P_D \cdot \theta$$

where
$T_A$ = Ambient Temperature $P_D$ = Power Dissipation due to Pulsed Power Operation $\theta$ = Thermal Resistance of Assembled Unit as Seen by IMPATT Diode Thus, the normal operation produces a given amount of heating. This must be taken as a baseline level and must never, by itself, be able to raise the junction temperature above an acceptable level. For any given application, (i.e., specification of power level, duty cycle and pulse repetition rate), the highest expected ambient temperature must be one at which the junction temperature is precisely at or below the desired level as produced by the baseline heating. For any lower ambient there can be auxiliary heating added to bring the junction temperature up to the desired level. This desired level for IMPATTs is less than at 200° C. and typically about 175° C. The actual level below the upper limit is not critical but rather the maintenance of the chosen level is the key to constant power and frequency over a wide ambient temperature range.

With the heating scheme of the present invention the junction temperature is given by $$t_j = T_A + P_D \cdot \theta + P_H \cdot \theta$$

where $P_H = V_{bias} \cdot I_{bias}$ (1- duty cycle) with $V_{bias} > V_{breakdown}$ and $I_{bias} = f(T_j)$ The last term in the equation is added to the dissipative heating of the previous paragraph. This additive term is variable, and essentially tracks junction temperature as discussed in detail below. It is dependent upon both the setting of the bias voltage level and upon the thermal resistance of the platform. When the ambient temperature is low and the diode is cooled at a higher rate the junction needs more heating; when the ambient temperature is high and the diode is cooled at a lesser rate the junction requires less heating. These heating requirements are met by the inverse proportionality of the variable junction heating with junction temperature. The junction temperature is driven to confinement within a very narrow range, the median of which is dependent upon the setting of the bias voltage level (for a given thermal resistance).

Figure 7:
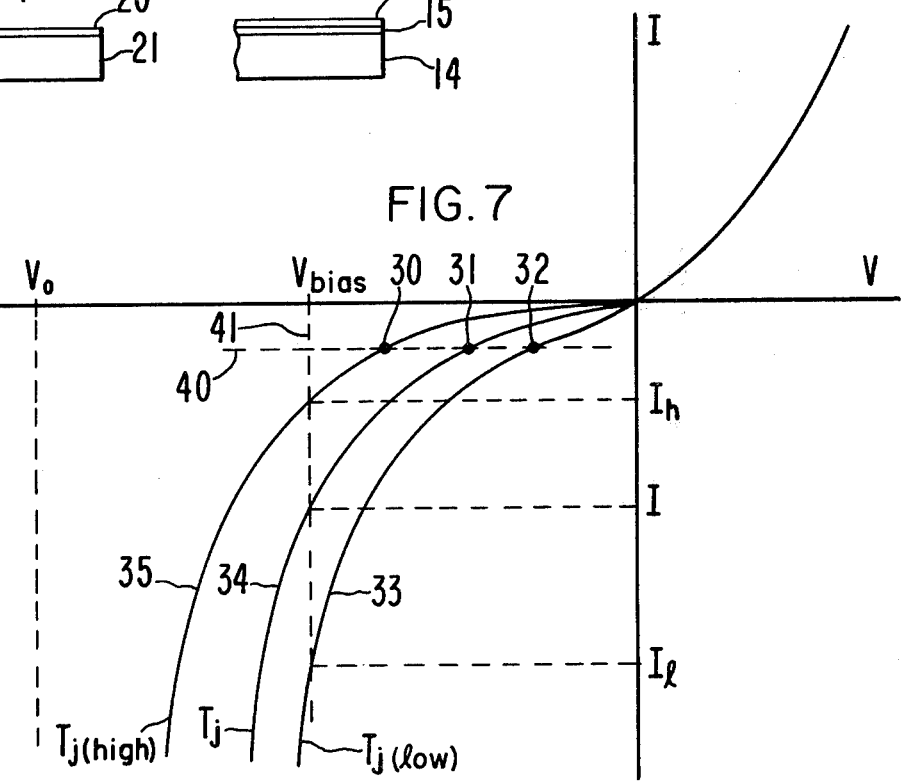
FIG. 7 is a series of current/voltage curves for various junction temperatures for the IMPATT diode of the IMPATT oscillator of the present invention.

By reference to FIG. 7 one can see the I-V characteristics for an IMPATT diode as a function of junction temperature. Curves 33, 34, 35 . . . represent increasing junction temperatures and are somewhat exaggerated to show the effect on which this invention is based. The curves are likely, in reality, to be bunched closer together with small changes in voltage producing very large changes in current. Dotted line 40 interconnects the breakdown condition 30, 31, 32 . . . for each of the curves. The operating voltage, $V_o$, then, must be in the reversed biased region, well above the breakdown voltage associated with any given $T_j$. The input power during pulsed operation will then be the product of Vo and the current for the associated instantaneous $T_j$, i.e., the I associated with the intersection of the $T_j$ curve and $x = V_o$.

In accordance with the present invention, during the non-oscillating subperiods of operation (the baseline portions of the curves of FIGS. 6a and 6c), a bias voltage is maintained across the junction. This voltage is selected to be greater than that for the breakdown condition for any expected $T_j$. Thus, as shown in FIG. 7 by the intersection of vertical line 41 with the $T_j$ curves a current will be drawn across the junction during these otherwise quiescent portions of the duty cycle which depends upon the temperature of the diode junction. Thus, when the junction temperature is lower, i.e., is $T_j$ (low) as described by curve 33, a current $I_l$ is drawn; when the junction temperature is average, i.e., $T_j$, as described by curve 34, a current I is drawn; and when the junction temperature, is higher, i.e., $T_j$ (high) as described by curve 35, than a current $I_h$ is drawn. Since $I_l > I > I_h$, the colder the junction, the greater the current. Thus, heating is inversely proportional to junction temperature so that the time average of the junction temperature will be bracketed within a narrow range. As the range is exceeded for any reason on the lower side the increase in heating pushes $T_j$ back within the range; as the range is exceeded for any reason on the higher side the decrease in heating pushes $T_j$ back within the range. This phenomenon will effectively stabilize junction temperature providing the bias voltage is always greater than the breakdown voltage for any $T_j$ to be encountered and providing the dissipative heating factor is not so great that at the highest expected ambient, the junction temperature exceeds the range with no contribution from variable heating. The selection of the thermal resistance of the platform in combination with the bias voltage will determine the range within which $T_j$ resides.

The advantages of operation of the thermally stabilized IMPATT oscillator are physically based primarily on the stability of the junction temperature over a wide ambient range. This range will typically be from about $-54°$ C. to about 80° C. The stable junction temperature, typically set at about 175° C., is associated with a constant power output over this wide range of ambient temperature since the variable heating is applied in inverse proportion to the ambient temperature. In addition, the absolute frequency is kept more constant. Finally, chirp—the variation of frequency over the pulse width—is reduced. This technique is extremely reliable and efficient since only the small physical volume around the junction experiences heating, thermal response time is low and heating efficiency is inherently high.

We claim:

1. In an IMPATT oscillator which is temperature stabilized for pulsed operation by causing a heating current to flow across the junction of the IMPATT diode during interpulse periods when said IMPATT oscillator is not oscillating, the improvement comprising:

a modulator electrically connected to said IMPATT diode, said modulator impressing an operating voltage across the junction of said IMPATT diode during oscillating subperiods and impressing a constant bias voltage across the junction of said IMPATT diode during said interpulse periods when said IMPATT diode is not oscillating to thereby cause a variable heating current to flow during said interpulse periods, said heating current bearing an inverse relationship with the instantaneous temperature of the junction.

2. The improved IMPATT oscillator of claim 1 in combination with a platform on which to mount said IMPATT diode, said platform having an insulating base and an overlying layer of electrically and thermally conducting material applied thereon, said IMPATT diode being mounted on said platform in low thermal resistance contact with said layer of electrically and thermally conducting material; and a housing defining a resonating cavity and adapted to receive said platform so that said layer of electrically and thermally conductive material makes low thermal resistance contact with said housing.

3. An improved IMPATT oscillator in accordance with claim 2 wherein said layer of thermally conductive material comprises a layer of a highly thermally conductive material applied to a layer of a less thermally conductive but mechanically strong material.

4. An improved IMPATT oscillator in accordance with claim 3 wherein said layer of a highly thermally conductive material is a layer of gold and said layer of a less thermally conductive but mechanically strong material is a layer of stainless steel.

5. An improved IMPATT oscillator in accordance with claim 3 wherein said modulator includes a constant voltage source to permit application of a bias voltage during nonoscillating subperiods.

6. An improved IMPACT oscillator in accordance with claim 2 wherein said layer of thermally conductive material is a layer of nickel.

* * * * *